(12) United States Patent
Kreupl et al.

(10) Patent No.: US 8,319,259 B2
(45) Date of Patent: Nov. 27, 2012

(54) SEMICONDUCTOR POWER SWITCH HAVING NANOWIRES

(75) Inventors: Franz Kreupl, München (DE); Robert Seidel, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 1082 days.

(21) Appl. No.: 10/587,062

(22) PCT Filed: Jan. 19, 2005

(86) PCT No.: PCT/DE2005/000069
§ 371 (c)(1),
(2), (4) Date: Aug. 19, 2008

(87) PCT Pub. No.: WO2005/071754
PCT Pub. Date: Aug. 4, 2005

(65) Prior Publication Data
US 2008/0296557 A1    Dec. 4, 2008

(30) Foreign Application Priority Data
Jan. 22, 2004  (DE) .......................... 10 2004 003 374

(51) Int. Cl.
*H01L 29/76* (2006.01)
(52) U.S. Cl. ............ 257/213; 257/24; 257/30; 257/314; 257/328; 257/368; 257/E21.404; 257/E29.245
(58) Field of Classification Search .................. None
See application file for complete search history.

(56) References Cited

U.S. PATENT DOCUMENTS

| | | | | |
|---|---|---|---|---|
| 4,769,683 A | * | 9/1988 | Goronkin et al. | 257/20 |
| 4,899,201 A | * | 2/1990 | Xu et al. | 257/20 |
| 4,999,682 A | * | 3/1991 | Xu et al. | 257/13 |
| 5,532,184 A | * | 7/1996 | Kato | 438/172 |
| 5,612,563 A | | 3/1997 | Fitch et al. | |
| 5,646,418 A | * | 7/1997 | Frazier et al. | 257/4 |
| 6,566,704 B2 | | 5/2003 | Choi et al. | |
| 6,570,220 B2 | * | 5/2003 | Doyle et al. | 257/345 |
| 6,740,910 B2 | * | 5/2004 | Roesner et al. | 257/213 |
| 6,855,606 B2 | * | 2/2005 | Chen et al. | 438/283 |

(Continued)

FOREIGN PATENT DOCUMENTS
DE    4218650    12/1993
(Continued)

OTHER PUBLICATIONS

Francois Leonard and J. Tersoff, "Multiple Functionality in Nanotube Transistors", vol. 88, No. 25, Physical Review Letters, Jun. 24, 2002.

(Continued)

*Primary Examiner* — Zandra Smith
*Assistant Examiner* — Khanh Duong
(74) *Attorney, Agent, or Firm* — Dicke, Billig & Czaja, PLLC (57) ABSTRACT

A semiconductor power switch and method is disclosed. In one Embodiment, the semiconductor power switch has a source contact, a drain contact, a semiconductor structure which is provided between the source contact and the drain contact, and a gate which can be used to control a current flow through the semiconductor structure between the source contact and the drain contact. The semiconductor structure has a plurality of nanowires which are connected in parallel and are arranged in such a manner that each nanowire forms an electrical connection between the source contact and the drain contact.

17 Claims, 8 Drawing Sheets

U.S. PATENT DOCUMENTS

| | | | |
|---|---|---|---|
| 7,015,497 B1 * | 3/2006 | Berger | 257/14 |
| 7,067,867 B2 * | 6/2006 | Duan et al. | 257/296 |
| 2002/0117659 A1 | 8/2002 | Lieber et al. | |
| 2002/0163079 A1 | 11/2002 | Awano | |
| 2003/0098488 A1 | 5/2003 | O'Keeffe et al. | |
| 2003/0132461 A1 | 7/2003 | Roesner et al. | |
| 2003/0178617 A1 | 9/2003 | Appenzeller et al. | |

FOREIGN PATENT DOCUMENTS

| | | |
|---|---|---|
| DE | 10036897 | 1/2002 |
| DE | 10324752 | 1/2005 |
| EP | 0452950 | 10/1991 |
| WO | WO00/51186 | 8/2000 |
| WO | WO01/57917 | 8/2001 |
| WO | WO2004/040666 | 5/2004 |

OTHER PUBLICATIONS

Francois Leonard and J. Tersoff, "Negative Differential Resistance in Nanotube Devices", vol. 85, No. 22, Physical Review Letters, Nov. 27, 2000.

* cited by examiner

SEMICONDUCTOR POWER SWITCH HAVING NANOWIRES

CROSS REFERENCE TO RELATED APPLICATION

This Utility Patent Application claims the benefit of the filing date of German Application No. 10 2004 003 374.9, filed Jan. 22, 2004, and International Application No. PCT/DE2005/000069, filed Jan. 19, 2005, both of which are herein incorporated by reference.

BACKGROUND

The invention relates to a semiconductor power switch and to a method which is suitable for producing the latter.

Semiconductor power switches are found in a large number of devices in our immediate surroundings and prove their uses there, for example in the control and regulation of loads of up to several kilowatts in lamps, motors or heating systems. Even in automotive technology, more and more power electronics will be concealed in future in order to satisfy the wish for convenient setting possibilities which can be electronically regulated.

In the meantime, semiconductor power switches are capable of processing voltages of up to 1000 V and current densities of up to 2000 A/cm². CoolMOS power switches achieve current densities of 2000 A/cm² and best on resistance values of approximately 20 mΩmm². Similar performance data may also be achieved with other silicon-based semiconductor power switches. In this case, the primary aim is to achieve an on resistance which is as small as possible since this makes it possible to considerably reduce the power losses which occur.

For these and other reasons, there is a need for the present invention.

SUMMARY

The present invention provides a semiconductor power switch which can be used to further improve the abovementioned on resistance values.

In one embodiment, the inventive semiconductor power switch has a source contact, a drain contact, a semiconductor structure which is provided between the source contact and the drain contact, and a gate which can be used to control a current flow through the semiconductor structure between the source contact and the drain contact. The semiconductor structure has a plurality of nanowires which are connected in parallel and are arranged in such a manner that each nanowire forms an electrical connection between the source contact and the drain contact.

The use of nanowires makes it possible to obtain semiconductor power switches whose on resistance per unit area is smaller by orders of magnitude, and the maximum current densities achieved in this case are greater by orders of magnitude, than in conventional power switches: in the case of a nanowire density of 100 nanowires/μm², the on resistance is thus already smaller by a factor of 20, and the maximum current density is greater by a factor of 100, than in conventional semiconductor power switches, for example silicon power switches. Another advantage of the inventive semiconductor power switch is that, on account of internal scattering effects, the short circuit current within an individual nanowire is limited, for example to approximately 24 μA in the case of a carbon nanotube. The inventive semiconductor power switch can therefore also be used as a starting current limiter.

In order to improve understanding of the invention, the physical properties of nanowires shall be discussed briefly below. Nanowires are one-dimensional structures which may have metallic properties or semiconductor properties. In this context, "one-dimensional" means that, on account of the small dimensions of the nanowires (nanometer range), the individual energy levels of the electrons are further apart than the thermal energy (~25 meV), with the result that electrons stay only in one conduction channel. Nanowires may be, for example, tubes ("hollow" on the inside), thin wires ("filled" with material), thin areas or else individual chains of atoms.

In this invention, the electronic properties of the nanowires, for example carbon nanotubes or other one-dimensional structures, are used to produce power electronic components (switching of several amperes) which, as a result of their nanostructured design, achieve considerably better performance than conventional power components. According to the invention, considerably higher currents/voltages than in conventional nanoelectronic components (0.1-5 V, 25 μA) can thus be processed, for example voltages of up to more than 500 V and currents of more than 2000 A/cm². The decisive factor in this case is the combination of a parallel circuit comprising a plurality of nanowires and the high charge carrier mobility in these one-dimensional structures together with a scaling rule for the length of these nanowires.

The nanowires used in the inventive semiconductor power switch may, in principle, have any desired structure and are composed of a material having semiconductor properties, for example silicon or carbon, carbon nanotubes being used, in particular, according to the invention. The small on resistance which can be achieved using nanowires is based on the fact that electrons which are passed through a nanowire are randomly scattered with a very much lower probability than electrons which flow through an expanded semiconductor crystal. Carbon nanotubes, for example, thus exhibit the highest mobility (respectively measured at room temperature) of more than 100,000 cm²/Vs.

The length of the nanowires is preferably ((0.2 μm) * (maximum value of the voltage (in volts) which is applied to the semiconductor power switch)). However, the invention is not restricted to this rule of thumb.

The nanowires may be connected in parallel in a plurality of ways. The nanowires are preferably in the form of "small rods" which run parallel to one another, one end of each small rod making contact with the source contact and the other end making contact with the drain contact. However, the nanowires need not necessarily have a rod-shaped configuration; curvilinear shapes are also possible, in principle. The important factor is that each nanowire establishes an independent electrical connection between the source contact and the drain contact, with the result that there is a parallel circuit of electrical connections between the source and drain contacts.

In a first preferred embodiment, the gate of the semiconductor power switch is implemented in the form of a gate layer which is provided between the source contact and the drain contact and is permeated by the nanowires. The nanowires are electrically insulated from the gate layer. In this embodiment, the gate layer is thus "penetrated" by the nanowires.

In a second preferred embodiment, the gate is implemented in the form of a plurality of gate bands whose longitudinal orientation respectively runs perpendicular to the orientation of the nanowires and whose transverse orientation corresponds to the orientation of the nanowires, the nanowires being electrically insulated from the gate, i.e. the gate bands. In this embodiment, the gate is thus not penetrated by the nanowires but rather the nanowires run parallel to surfaces of the gate bands. The nanowires preferably run within nanowire trenches which are provided between the gate bands, i.e. nanowire trenches and gate bands alternate with one another.

In principle, the gate bands and/or trenches may be at any desired distance from one another but the gate bands and/or the nanowire trenches are preferably at an equal distance from one another.

Tubes may be provided within the nanowire trenches, at least one nanowire respectively running within said tubes; a plurality of nanowires preferably run within a tube. In this case, the tubes are used as a guide during the process of growing the nanowires.

Insulation layers may be provided between the nanowire trenches and the gate bands, for example, in order to insulate the nanowires from the gate bands.

In the embodiment in which the gate is implemented in the form of a gate layer, in particular, the nanowires should be insulated from one another and should be at an equal distance from one another. However, this is not absolutely necessary, particularly in the case of the second embodiment in which the gate is implemented in the form of a plurality of gate bands. In that case, the nanowires may also make contact with one another within the nanowire trenches or within the tubes and may be at an unequal distance from one another.

The gate layer/the gate bands preferably has/have a layer thickness/band width which is approximately one third of the distance between the source contact and the drain contact. However, the invention is not restricted to such thicknesses/widths; any desired other values are likewise possible.

The gate bands may respectively include a continuous layer or be respectively split into a plurality of gate subbands which are insulated from one another. In the latter case, the longitudinal orientation of each gate subband runs perpendicular to the orientation of the nanowires, the transverse orientation of the gate subbands corresponding to the orientation of the nanowires. Each gate band is thus split into a plurality of small bands which run parallel to one another and have the same orientation as the gate band.

The gate subbands are preferably designed such that they can be driven individually, i.e. each of the gate subbands may be set to an individual potential. The gate subbands of a gate band are advantageously at an equal distance from one another. The vertical positions of the gate subbands of a particular gate band may be shifted or rectified with respect to the vertical positions of the gate subbands of adjacent gate bands.

Splitting the gate bands into gate subbands makes it possible to improve the blocking effect of the inventive semiconductor power switch as follows: in the blocked state, the potentials of the gate subbands are selected in such a manner that the bandgap structures of the nanowires assume an undulating shape. This may be achieved, for example, by the potentials of gate subbands which are located above one another having alternating values, i.e. two gate subbands which are arranged directly above one another have different potentials; however, the potential of each second gate subband has the same value. In this example, the adjacent gate subbands on a plane (same vertical position) should have the same potential in the blocked state. The alternating potential structure causes the band gap of the nanowires which are located between the adjacent gate subbands to be bent into an undulating structure. In this case, the undulating structure causes electrons or holes which are moving between the source and drain contacts to be captured, with the result that the current flow between the source and drain contacts is impeded which, in turn, improves the blocking capability of the semiconductor power switch. In contrast, in the on state of the semiconductor power switch, the gate subbands of a gate band are set to the same potential, i.e. all of the gate subbands are set to the same potential in this case. The undulating band structure is thus removed and the transmission properties of the semiconductor structure (nanowires) as regards holes and electrons are improved.

In one preferred embodiment, the nanowires are semiconducting carbon nanotubes. The nanowires may contain
  silicon;
  germanium;
  at least one of the III-V semiconductors BN, BP, BAs, AlN, AlP, AlAs, AlSb, GaN, GaP, GaAs, GaSb, InN, InP, InAs, InSb;
  at least one of the II-VI semiconductors ZnO, ZnS, ZnSe, ZnTe, CdS, CdSe, CdTe, HgS, HgSe, HgTe, BeS, BeSe, BeTe, MgS, MgSe;
  at least one of the compounds GeS, GeSe, GeTe, SnS, SnSe, SnTe, PbO, PbS, PbSe, PbTe,
  at least one of the compounds CuF, CuCI, CuBr, CuI, AgF, AgCI, AgBr, AgI
or a combination of these materials or may be composed of these materials. The nanowires may be p-doped or n-doped.

The invention also provides a method for producing a semiconductor power switch, said method having the following process:
  forming a layer structure on a drain contact, said layer structure having a first insulation layer, a gate layer which is arranged above the latter and a second insulation layer which is arranged above the gate layer,
  forming trenches in the layer structure,
  forming nanowires within trenches, and
  forming a source contact on the top side of the layer structure.

After the layer structure has been formed, the following process is preferably carried out:
  forming first trenches in the layer structure,
  filling the first trenches with gate oxide,
  forming second trenches in the gate oxide, the second trenches reaching as far as the drain contact,
  forming nanowires within second trenches, and
  forming a source contact on the top side of the layer structure. The first trenches are preferably likewise formed down to the drain contact but this is not absolutely necessary.

The drain contact is preferably a molybdenum or tantalum sheet but may also be a silicon substrate which is provided with a metal layer. In order to improve the growth behavior of the nanowires, a catalyst may be deposited, before said nanowires are formed, on the molybdenum or tantalum sheet or the silicon substrate before the layer structure is formed or immediately before the nanowires are formed (i.e. after the trenches have been formed). In order to stabilize the production method, the drain contact may first of all be formed on a sacrificial substrate which is then dissolved after the semiconductor power switch has been completed.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description.

The elements of the drawings are not necessarily to scale relative to each other. Like reference numerals designate corresponding similar parts

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A first embodiment 1 (illustrated in FIG. 1) of an inventive semiconductor power switch has a source contact 2, a drain contact 3, a plurality of nanowires 4, a gate 5, a gate connection 6, a first insulation layer 7 and a second insulation layer 8.

Figure 1:
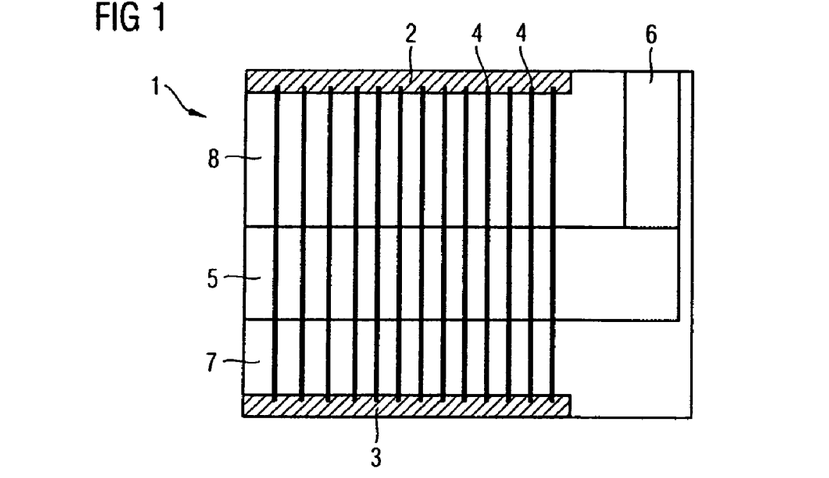
FIG. 1 illustrates a cross-sectional illustration of a first embodiment of an inventive semiconductor power switch.

The nanowires 4 are arranged such that they are parallel to one another and are essentially at an equal distance from one another, the upper ends of the nanowires 4 being electrically connected to the source contact 2 and the lower ends of the nanowires 4 being electrically connected to the drain contact 3. The gate 5 is in the form of a gate layer which is penetrated by the nanowires 4, the nanowires 4 being electrically insulated from the gate 5 (the gate layer). The gate electrode is thus arranged coaxially with respect to the nanowires, with the result that the best possible capacitive coupling of the gate electrode to the nanowire is obtained. The length of the nanowires is preferably ((0.2 μm) * (maximum value of the voltage (in volts) which is applied to the semiconductor power switch)). The thickness of the gate layer 5 is preferably one third of the distance between the source contact 2 and the drain contact 3. The gate layer 5 should be closer to that contact whose potential is closest to the ground potential (in this case: the drain contact). The gate layer 5 may have, for example, a square, circular or else annular form.

As already mentioned, depending on the dielectric strength of the semiconductor power switch to be achieved, a length of the nanowires of 0.2 μm per volt of applied voltage is recommended, i.e. a length of 15 to 25 Pm, for example, for an operating voltage of 100 volts. Nanowires of this length have very high mobility of approximately 100,000 $cm^2/NVs$.

The design illustrated in FIG. 1 can be used, in particular, for semiconductor power switches having a size of square millimeters or square centimeters. However, the invention is not restricted to this and use for smaller or larger semiconductor power switches is likewise conceivable.

Figure 9:
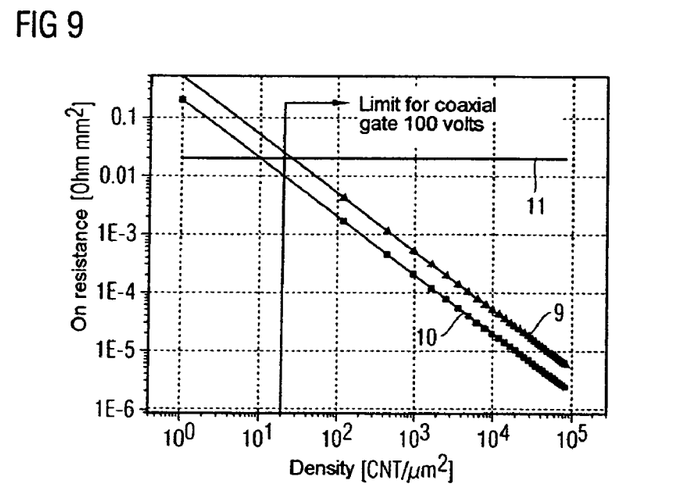
FIG. 9 illustrates a graph illustrating the dependence of the on resistance on the nanowire density.

FIG. 9 illustrates the on resistance of the arrangement shown in FIG. 1 which can be achieved on the basis of the nanowire density. The characteristic curve marked using reference numeral 9 corresponds to an assumed on resistance value of 500 kΩ per nanowire and the characteristic curve marked using reference numeral 10 corresponds to an assumed on resistance value of 200 kΩ per nanowire. The characteristic curve marked using reference numeral 11 corresponds to the currently best possible characteristic curve of a conventional semiconductor power switch which is based on silicon technology, for example. It can be seen from FIG. 9 that the properties of the semiconductor power switch shown in FIG. 1 are considerably better than those of a conventional semiconductor power switch.

Figure 10:
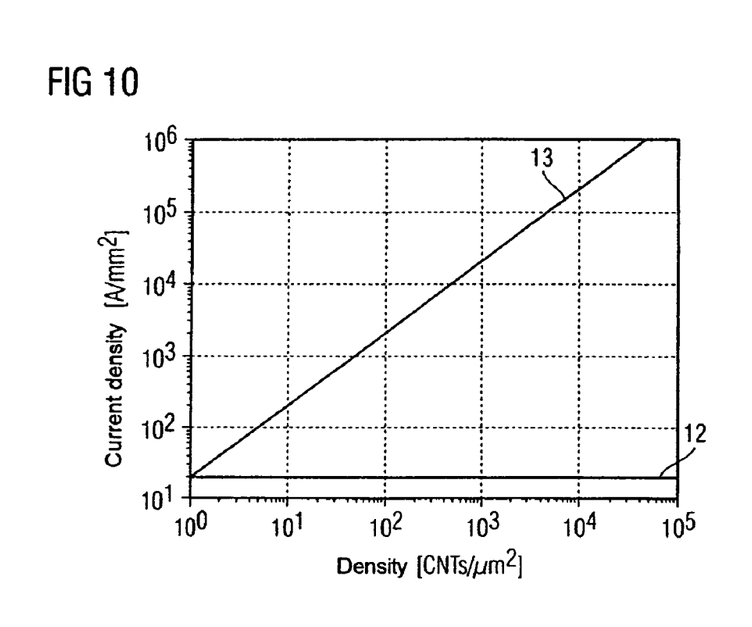
FIG. 10 illustrates a graph illustrating the dependence of the maximum possible current density on the nanowire density.

In this connection, FIG. 10 which illustrates the current-carrying capacity of the arrangement shown in FIG. 1 on the basis of the nanowire density shall also be discussed. In this case, reference numeral 12 denotes the currently best possible characteristic curve of a conventional semiconductor power switch and reference numeral 13 denotes the characteristic curve of the inventive semiconductor power switch shown in FIG. 1. It can clearly be seen that the inventive semiconductor power switch has the better values.

The embodiment illustrated in FIG. 1 can be produced, for example, as follows: a contact material, for example molybdenum, is first of all applied to an NaCl, $SiO_2$, Si or some other substrate. A suitable catalyst is deposited on the substrate. Iron, nickel, cobalt or compounds of these elements are suitable, for example, for growing Si nanowires or nanowires composed of II-V or IV semiconductors. For the special case of carbon nanotubes, the catalyst should be a silicide-forming material, for example gold, silver or platinum. The first insulation layer 7 (for example oxide), on which the gate layer 5 is in turn deposited, is then applied. The gate layer 5 is patterned and provided with dielectric, i.e. the gate layer is provided with holes which reach as far as the insulation layer 7 and these holes are then filled again with an insulation layer. The second insulation layer 8 is applied to the gate layer 5. Holes are then etched into the layer structure comprising the first insulation layer 7, the gate layer 5 and the second insulation layer 8, and nanotubes or nanowires are grown in the holes.

As an alternative to this, a layer stack comprising a first insulation layer 7, a gate 5 and a second insulation layer 8 may be deposited, and holes may be etched to the bottom using a dry etching process. The holes are again tapered by depositing an insulation layer using an atomic layer deposition (ALD) or CVD method, the gate oxide simultaneously being realized over the gate. A spacer etching process then again exposes the bottom/catalyst and the nanowires 4 are grown in the holes which have been produced.

Any cavities may be sealed, for example, with a spin-on glass. Electrodeposition is possible. The source contact 2 is applied to the top side of the layer structure. The substrate (sacrificial substrate) is dissolved, thus exposing the contact material (drain contact 3).

Figure 2:
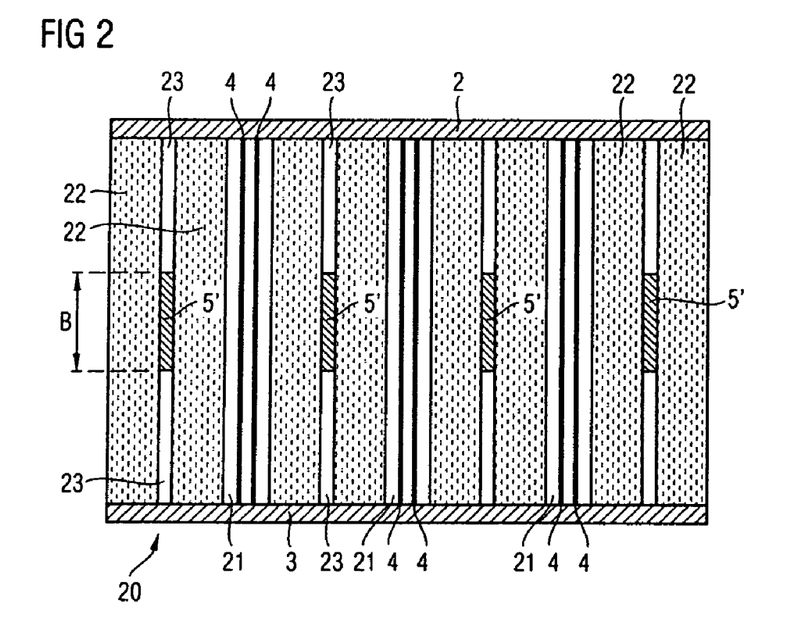
FIG. 2 illustrates a cross-sectional illustration of a second embodiment of an inventive semiconductor power switch.
Figure 3A:
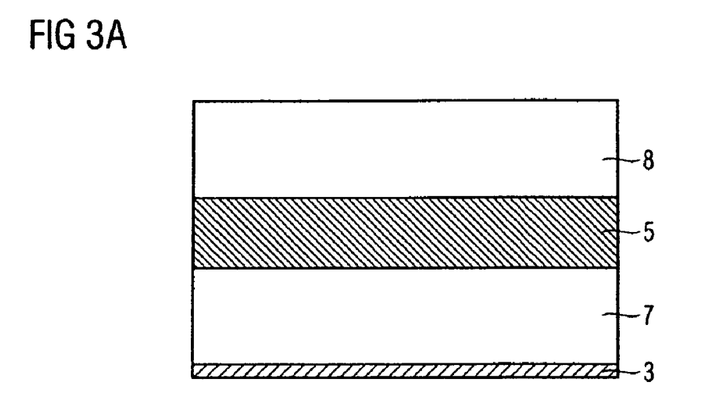
FIGS. 3A to 3D illustrate a first to a fourth process of a preferred embodiment of the inventive method for producing the semiconductor power switch illustrated in FIG. 2.
Figure 3B:
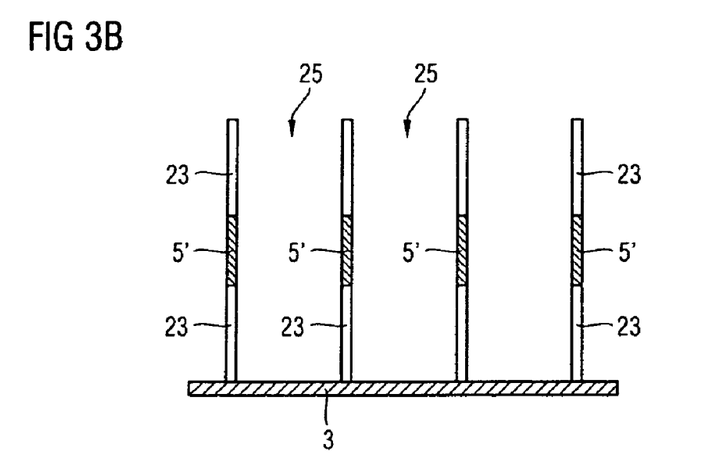
Figure 3C:
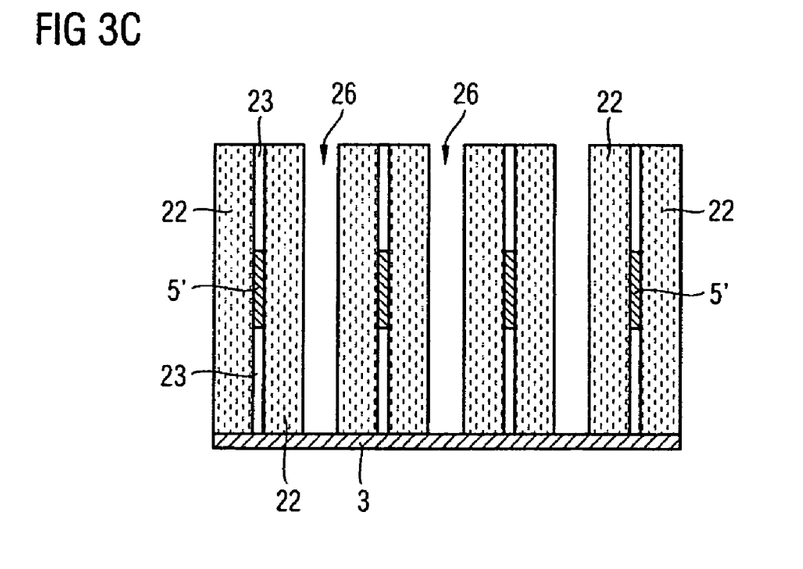
Figure 3D:
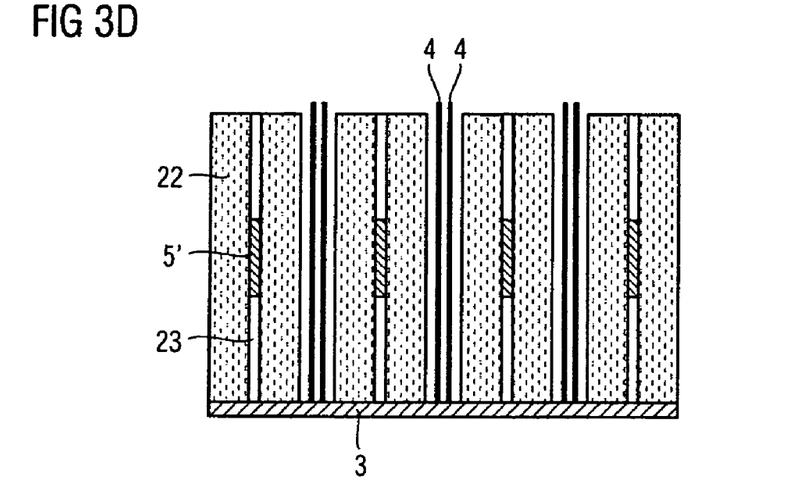

FIG. 2 illustrates a second embodiment 20 of the inventive semiconductor power switch. An important difference from the embodiment shown in FIG. 1 is that the gate is implemented in the form of a plurality of gate bands 5' whose longitudinal orientation respectively runs perpendicular to the orientation of the nanowires 4, that is to say points out of the plane of the drawing and into the plane of the drawing, and whose transverse orientation corresponds to the orientation of the nanowires 4. The nanowires 4 are arranged within trenches 21. Each gate band 5' is electrically insulated from the nanowires 4 by means of insulating layers (gate oxide layers) 22. Further insulating layers (oxide layers) 23 are provided above and below the gate bands 5'.

Figure 4:
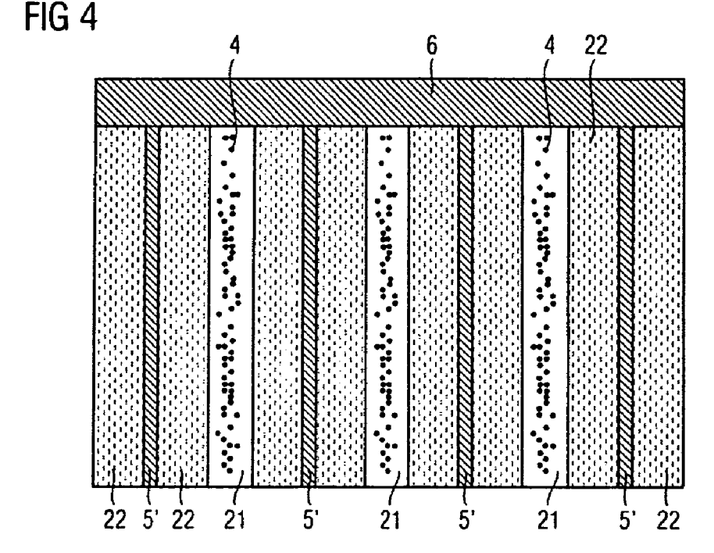
FIG. 4 illustrates a plan view of a first embodiment of the semiconductor power switch illustrated in FIG. 2.
Figure 5:
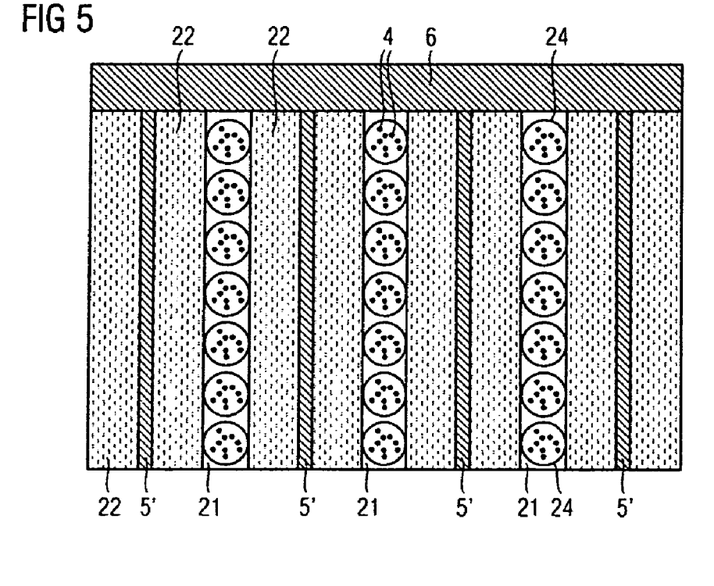
FIG. 5 illustrates a plan view of a second embodiment of the semiconductor power switch s illustrated in FIG. 2.

FIGS. 4 and 5 illustrate plan views of two possible embodiments of the semiconductor power switch illustrated in FIG. 2. In FIG. 4, the nanowires 4 are distributed inhomogeneously within the trenches 21 and, in FIG. 5, a plurality of tubes 24 are provided within the trenches 21, at least one nanowire 4 running within each tube 24. In the embodiment shown in FIG. 2 as well, a width B of the gate bands 5' is preferably one third of the distance between the source contact 2 and the drain contact 3.

A preferred embodiment of the inventive method for producing the semiconductor power switch illustrated in FIG. 2 shall be explained in more detail below with reference to FIGS. 3A to 3D.

In a first process (FIG. 3A), a first insulation layer 7 is applied to a drain contact 3, a gate layer 5 is applied to said insulation layer and a second insulating layer 8 is in turn applied to said gate layer. In a second process (FIG. 3B), first trenches 25 are formed in the resulting layer structure, for example by means of an etching process. The formation of the first trenches 25 produces gate bands 5' and insulating layers 23 which are arranged above and below the latter. The first trenches 25 preferably reach down to the drain contact 3.

In a third process (FIG. 3C), the first trenches 25 are filled with an insulation material, and second trenches 26 are then formed in the insulation material. The second trenches 26 reach down to the drain contact 3. The gate bands 5' and the insulation layers 23 which lie above/below the latter are surrounded by insulating layers 22 after this process step.

In a fourth process (FIG. 3D), nanowires 4 are grown in the second trenches 26. A source contact 2 is then formed.

The embodiment illustrated in FIG. 2 has the advantage over the embodiment illustrated in FIG. 1 that the "breakdown strength" of the semiconductor power switch is higher while simultaneously preserving a high nanowire density:

The semiconductor power switch illustrated in FIG. 1 has the disadvantage that, when high voltages are applied, correspondingly thick insulating layers which insulate the nanowires from the gate 5 also have to be used in order to prevent breakdown as a result of the insulating layer. In the case of a voltage of 100 V which is to be applied, the thickness of the insulating layer should be at least 100 nm, for example. However, this would mean that, in the case of a coaxial implementation in FIG. 1 using a hexagonally densest packing of nanowires, a maximum density of 20 nanowires per $\mu m^2$ would be possible, which would improve the on resistances of conventional silicon switches only by a factor of 2 and the current-carrying capacity by a factor of 10. The embodiment shown in FIG. 2 therefore uses parallel gate bands 5' for the semiconductor power switch with vertically oriented nanowires 4. Despite voltages of approximately 500 V, this embodiment can be used to achieve densities of approximately 2000 nanowires (for example carbon nanowires or silicon nanowires) per $\mu m^2$.

The thickness of the drain contact is approximately 10 to 200 $\mu M$, the drain contact 3 preferably being composed of molybdenum or tantalum or containing these materials. A catalyst layer is also preferably applied to the drain contact 3.

Figure 11:
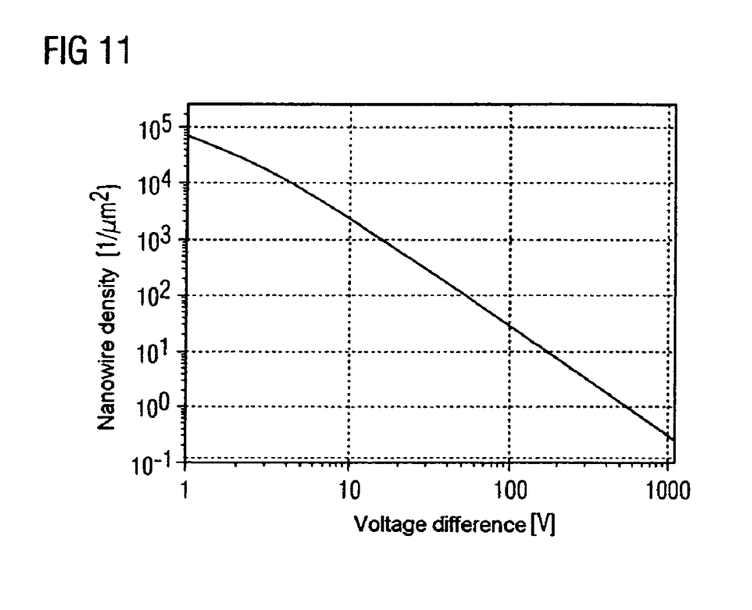
FIG. 11 illustrates a graph illustrating the relationship between a maximum possible nanowire density for a prescribed voltage difference between the nanowires and the gate for the semiconductor power switch illustrated in FIG. 1.
Figure 12:
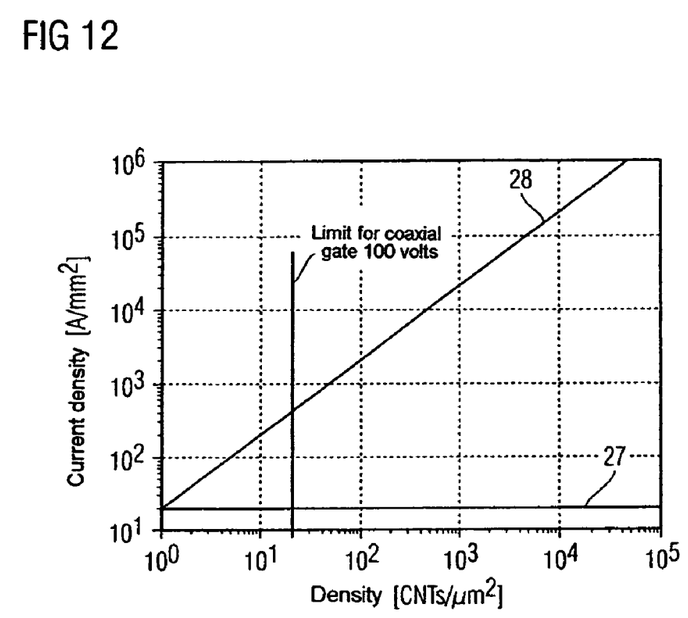
FIG. 12 illustrates a graph illustrating a maximum possible current density through the semiconductor power switch on the basis of the nanowire density.

In this connection, reference shall also be made to FIGS. 11 and 12. FIG. 11 illustrates the maximum possible nanowire density on the basis of assumed voltage differences between the nanowires and the gate for the semiconductor power switch which is shown in FIG. 1 and has a coaxial gate for a respective single nanowire. It can be seen that only small nanowire densities are possible in the case of large voltage differences. FIG. 12 illustrates the current density against the nanowire density for a conventional semiconductor power switch (characteristic curve 27) and for the inventive semiconductor power component (characteristic curve 28) illustrated in FIG. 2 ("CNT" corresponds to "carbon nanotube"). The characteristic curve 27 applies, in particular, to silicon power switches.

Figure 6:
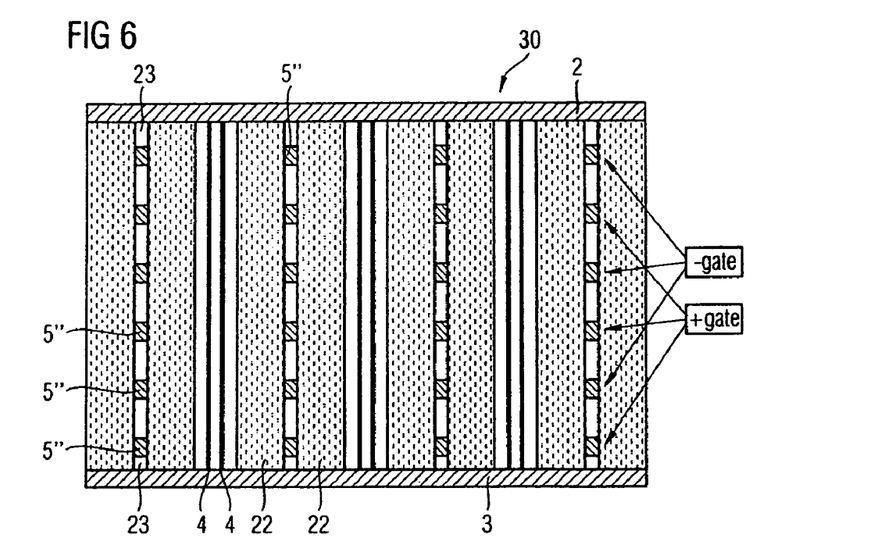
FIG. 6 illustrates a cross-sectional illustration of a third embodiment of the inventive semiconductor power switch.
Figure 7:
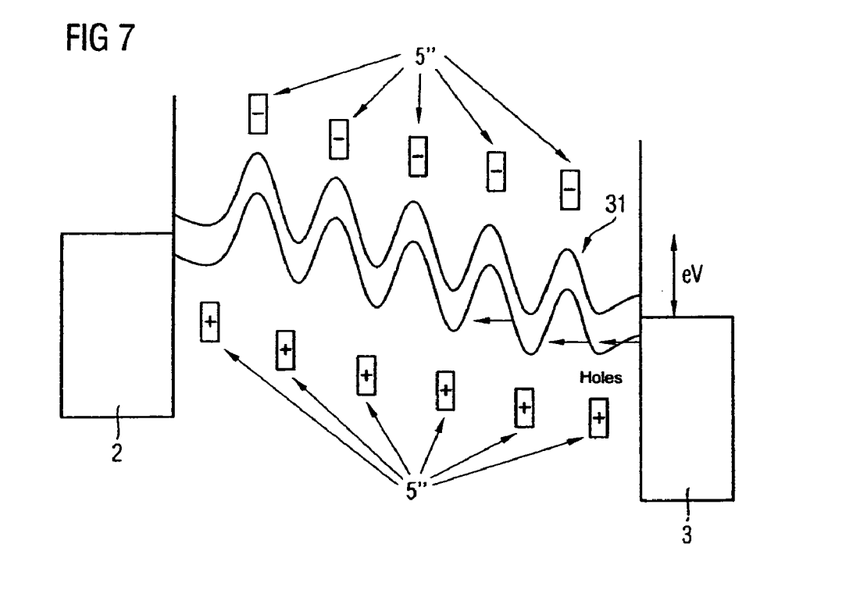
FIG. 7 illustrates a band structure which occurs in a blocked state in the semiconductor power switch illustrated in FIG. 6.
Figure 8:
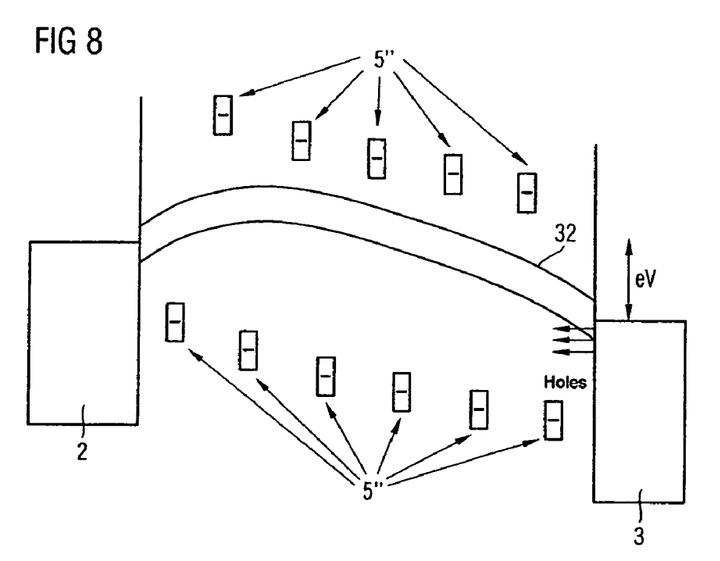
FIG. 8 illustrates a band structure which occurs in the on state in the semiconductor power switch illustrated in FIG. 6.

FIG. 6 illustrates a third embodiment 30 of the inventive semiconductor power switch. This embodiment differs from the embodiment shown in FIG. 2 by virtue of the fact that the gate bands 5' illustrated in FIG. 2 have been respectively split into a plurality of gate subbands 5". The gate subbands 5" are electrically insulated from one another and are at an equal distance from one another in this embodiment. Each of the gate subbands 5" can be connected to an individual potential value independently of the other gate subbands 5". If the gate subbands 5" of a gate band 5' are alternately connected to a positive/negative gate voltage, an undulating bandgap structure can be generated, as schematically illustrated in FIG. 7. The undulating bandgap structure 31 causes holes which wish to migrate from the drain contact 3 to the source contact 2 to be "captured". The equivalent also applies to the electrons which are not explicitly depicted in FIG. 7 but tunnel from the electrode marked using reference numeral 2 to the electrode marked using reference numeral 3 in FIG. 7. The blocking properties of the semiconductor power switch can thus be considerably improved: as described above, in the blocked state, the gate subbands 5" are supplied with voltage, with the result that the undulating bandgap structure illustrated in FIG. 7 is produced. In the on state of the semiconductor power switch, however, the same gate voltage is applied to all of the gate subbands 5" of a gate band 5', with the result that the bandgap structure 32 illustrated in FIG. 8 is produced. Holes may now migrate unimpeded from the drain contact 3 to the source contact 2.

The third embodiment 30 illustrated in FIG. 6 therefore makes it possible to suppress tunneling effects (which occur under normal circumstances) of electrons/holes through the Schottky barrier at the source contact 2 and at the drain contact 3 by forming the undulating bandgap structure 31 in the blocked state. To this end, the gate subbands 5" are alternately "biased", as a result of which a high cut-off behavior of the charge carriers results, the cut-off strength increasing exponentially with the number n of ±-modulated regions. Given the same forward current in the on state, the tunneling current (leakage current) in the blocked state can thus be reduced by a factor of e''. In this case, "eV" denotes the applied voltage. Since it is an energy diagram, this voltage is multiplied by "e".

The invention therefore provides gate structures having alternately conductive and nonconductive layers which are connected as a multiple gate arrangement with alternating polarity.

The invention claimed is:

1. A semiconductor power switch comprising:
   a source contact;
   a drain contact;
   a semiconductor structure provided between the source contact and the drain contact;
   a gate used to control a current flow through the semiconductor structure between the source contact and the drain contact; and
   wherein the semiconductor structure has a plurality of nanowires which are connected in parallel and are arranged in such a manner that each nanowire forms an electrical connection between the source contact and the drain contact,
   wherein the gate is implemented in the form of a plurality of gate bands whose longitudinal orientation respectively runs substantially perpendicular to the orientation of the nanowires and whose transverse orientation corresponds to the orientation of the nanowires, the nanowires being electrically insulated from the gate, and
   wherein each gate band is split into a plurality of gate subbands which are insulated from one another, the gate subbands being arranged above one another and each being designed such that it can be driven individually.

2. The semiconductor power switch of claim 1, wherein the length in μm of the nanowires is 0.2 * maximum value of the voltage (in V) which is applied to the semiconductor power switch.

3. The semiconductor power switch of claim 1, wherein the gate is implemented in the form of a gate layer which is provided between the source contact and the drain contact and is permeated by the nanowires, the nanowires being electrically insulated from the gate layer.

4. The semiconductor power switch of claim 3, wherein the gate layer has a layer thickness which is approximately ⅓ of the distance between the source contact and the drain contact; and
   wherein the gate bands have a band width which is approximately ⅓ of the distance between the source contact and the drain contact.

5. The semiconductor power switch of claim 1, wherein the nanowires run within trenches provided between the gate bands.

6. The semiconductor power switch of claim 5, wherein tubes are provided within the trenches, at least one nanowire respectively running within the tubes.

7. The semiconductor power switch of claim 5, wherein insulation layers are provided between the trenches and the gate bands.

8. The semiconductor power switch of claim 1, wherein the gate bands and/or trenches are at an equal distance from one another.

9. The semiconductor power switch of claim 1, wherein the nanowires are insulated from one another.

10. The semiconductor power switch of claim 1, wherein the nanowires are at an equal distance from one another.

11. The semiconductor power switch of claim 1, wherein the gate subbands of a gate band are at an equal distance from one another.

12. The semiconductor power switch of claim 11, wherein vertical positions of the gate subbands of a gate band are shifted with respect to vertical positions of the gate subbands of an adjacent gate band.

13. The semiconductor power switch of claim 1, wherein the nanowires are semiconducting carbon nanotubes.

14. The semiconductor power switch of claim 1, wherein the nanowires comprise at least one or more of the following materials:
   silicon;
   germanium;
   at least one of the III-V semiconductors BN, BP, BAs, AlN, AlP, AlAs, AlSb, GaN, GaP, GaAs, GaSb, InN, InP, InAs, InSb;
   at least one of the II-VI semiconductors ZnO, ZnS, ZnSe, ZnTe, CdS, CdSe, CdTe, HgS, HgSe, HgTe, BeS, BeSe, BeTe, MgS, MgSe;
   at least one of the compounds GeS, GeSe, GeTe, SnS, SnSe, SnTe, PbO, PbS, PbSe, PbTe;
   at least one of the compounds CuF, CuCl, CuBr, CuI, AgF, AgCl, AgBr, AgI.

15. The semiconductor power switch of claim 14, wherein the nanowires are p-doped or n-doped.

16. The method for improving the blocking effect of a semiconductor power switch comprising: providing a semiconductor power switch according to claim 1; and wherein, in the blocked state, selecting the potentials of the gate subbands in such a manner that the band gap structures of the nanowires assume an undulating shape.

17. A semiconductor power switch comprising:
   a source contact;
   a drain contact;
   means for providing a semiconductor structure between the source contact and the drain contact;
   a gate used to control a current flow through the semiconductor structure means between the source contact and the drain contact; and
   wherein the semiconductor structure means has a plurality of nanowires which are connected in parallel and are arranged in such a manner that each nanowire forms an electrical connection between the source contact and the drain contact,
   wherein the gate is implemented in the form of a plurality of gate bands whose longitudinal orientation respectively runs substantially perpendicular to the orientation of the nanowires and whose transverse orientation corresponds to the orientation of the nanowires, the nanowires being electrically insulated from the gate, and
   wherein each gate band is split into a plurality of gate subbands which are insulated from one another, the gate subbands being arranged above one another and each being designed such that it can be driven individually.

* * * * *